United States Patent
Moyal et al.

(10) Patent No.: US 7,893,772 B1
(45) Date of Patent: Feb. 22, 2011

(54) SYSTEM AND METHOD OF LOADING A PROGRAMMABLE COUNTER

(75) Inventors: Nathan Moyal, Mukilteo, WA (US); David Wright, San Diego, CA (US); Stephen O'Connor, Lake Oswego, OR (US)

(73) Assignee: Cypress Semiconductor Corporation, San Jose, CA (US)

( * ) Notice: Subject to any disclaimer, the term of this patent is extended or adjusted under 35 U.S.C. 154(b) by 100 days.

(21) Appl. No.: 12/327,751

(22) Filed: Dec. 3, 2008

Related U.S. Application Data

(60) Provisional application No. 60/992,011, filed on Dec. 3, 2007.

(51) Int. Cl.
*H03K 21/00* (2006.01)
*H03K 23/00* (2006.01)
*H03L 7/18* (2006.01)

(52) U.S. Cl. .......... 331/16; 331/25; 327/115; 327/117; 327/156

(58) Field of Classification Search .......... 331/1 A, 331/16–18, 25; 327/115, 117, 118, 156–159
See application file for complete search history.

(56) References Cited

U.S. PATENT DOCUMENTS

| | | | |
|---|---|---|---|
| 4,229,699 A | 10/1980 | Frissell | |
| 4,419,629 A | 12/1983 | O'Brien | |
| 4,504,862 A | 3/1985 | Achtstaetter | |
| 4,617,479 A | 10/1986 | Hartmann et al. | |
| 4,675,556 A | 6/1987 | Bazes | |
| 4,684,830 A | 8/1987 | Tsui et al. | |
| 4,750,149 A | 6/1988 | Miller | |
| 4,758,746 A | 7/1988 | Birkner et al. | |
| 4,758,747 A | 7/1988 | Young et al. | |
| 4,763,020 A | 8/1988 | Takata et al. | |
| 4,771,285 A | 9/1988 | Agrawal et al. | |
| 4,773,049 A | 9/1988 | Takemae | |
| 4,783,606 A | 11/1988 | Goetting | |
| 4,786,829 A | 11/1988 | Letcher | |
| 4,789,951 A | 12/1988 | Birkner et al. | |
| 4,835,414 A | 5/1989 | Freidin | |
| 4,878,200 A | 10/1989 | Asghar et al. | |
| 4,882,549 A | 11/1989 | Galani et al. | |
| 4,893,271 A | 1/1990 | Davis et al. | |
| 4,908,582 A | 3/1990 | Kawano et al. | |
| 4,912,342 A | 3/1990 | Wong et al. | |
| 4,918,641 A | 4/1990 | Jigour et al. | |
| 4,942,318 A | 7/1990 | Kawana | |
| 4,963,770 A | 10/1990 | Keida | |
| 4,980,653 A | 12/1990 | Shepherd | |

(Continued)

OTHER PUBLICATIONS

Sumi, Y. et al., "PLL Synthesizer with Multi-Programmable Divider and Multi-Phase Detector," IEEE International Conference on Consumer Electronics, THAM 13.3, 1999, pp. 252-253.

(Continued)

*Primary Examiner*—David Mis

(57) ABSTRACT

A system and method of loading a programmable counter includes storing a first digital divide value in a register. The first digital divide value is then loaded from the register to a programmable counter. The method further includes writing a second digital divide value to the register at a time responsive to a time remaining to complete a counting cycle of the programmable counter.

20 Claims, 13 Drawing Sheets

U.S. PATENT DOCUMENTS

| | | | |
|---|---|---|---|
| 4,999,526 A | 3/1991 | Dudley | |
| 5,023,484 A | 6/1991 | Pathak et al. | |
| 5,027,011 A | 6/1991 | Steele | |
| 5,046,035 A | 9/1991 | Jigour et al. | |
| 5,049,766 A | 9/1991 | van Driest et al. | |
| 5,053,646 A | 10/1991 | Higuchi | |
| 5,136,188 A | 8/1992 | Ha et al. | |
| 5,142,247 A | 8/1992 | Lada, Jr. et al. | |
| 5,144,254 A | 9/1992 | Wilke | |
| 5,144,582 A | 9/1992 | Steele | |
| 5,175,819 A | 12/1992 | Le Ngoc et al. | |
| 5,185,706 A | 2/1993 | Agrawal et al. | |
| 5,220,213 A | 6/1993 | Chan et al. | |
| 5,231,312 A | 7/1993 | Gongwer et al. | |
| 5,231,588 A | 7/1993 | Agrawal et al. | |
| 5,254,886 A | 10/1993 | El-Ayat et al. | |
| 5,258,668 A | 11/1993 | Cliff et al. | |
| 5,280,202 A | 1/1994 | Chan et al. | |
| 5,282,164 A | 1/1994 | Kawana | |
| 5,289,138 A | 2/1994 | Wang | |
| 5,302,866 A | 4/1994 | Chiang et al. | |
| 5,309,046 A | 5/1994 | Steele | |
| 5,329,460 A | 7/1994 | Agrawal et al. | |
| 5,334,952 A | 8/1994 | Maddy et al. | |
| 5,341,044 A | 8/1994 | Ahanin et al. | |
| 5,357,153 A | 10/1994 | Chiang et al. | |
| 5,384,745 A | 1/1995 | Konishi et al. | |
| 5,386,155 A | 1/1995 | Steele et al. | |
| 5,422,823 A | 6/1995 | Agrawal et al. | |
| 5,426,378 A | 6/1995 | Ong | |
| 5,432,747 A | 7/1995 | Fuller et al. | |
| 5,450,608 A | 9/1995 | Steele | |
| 5,451,887 A | 9/1995 | El Avat et al. | |
| 5,455,525 A | 10/1995 | Ho et al. | |
| 5,487,049 A | 1/1996 | Hang | |
| 5,491,814 A | 2/1996 | Yee et al. | |
| 5,506,982 A | 4/1996 | Hotta et al. | |
| 5,510,742 A | 4/1996 | Lemaire | |
| 5,521,529 A | 5/1996 | Agrawal et al. | |
| 5,528,509 A | 6/1996 | Sawai et al. | |
| 5,537,057 A | 7/1996 | Leong et al. | |
| 5,544,047 A | 8/1996 | Appel | |
| 5,550,782 A | 8/1996 | Cliff et al. | |
| 5,570,040 A | 10/1996 | Lytle et al. | |
| 5,587,945 A | 12/1996 | Lin et al. | |
| 5,589,782 A | 12/1996 | Sharpe-Geisler | |
| 5,594,365 A | 1/1997 | Agrawal et al. | |
| 5,594,366 A | 1/1997 | Khong | |
| 5,638,008 A | 6/1997 | Rangasayee et al. | |
| 5,646,901 A | 7/1997 | Sharpe-Geisler et al. | |
| 5,652,536 A | 7/1997 | Nookala et al. | |
| 5,670,896 A | 9/1997 | Diba et al. | |
| 5,684,434 A | 11/1997 | Mann et al. | |
| 5,689,195 A | 11/1997 | Cliff et al. | |
| 5,710,524 A | 1/1998 | Chou et al. | |
| 5,740,410 A | 4/1998 | McDermott | |
| 5,748,559 A | 5/1998 | Raza et al. | |
| 5,757,207 A | 5/1998 | Lytle et al. | |
| 5,774,703 A | 6/1998 | Weiss | |
| 5,781,030 A | 7/1998 | Agrawal et al. | |
| 5,799,176 A | 8/1998 | Kapusta et al. | |
| 5,811,987 A | 9/1998 | Ashmore, Jr. et al. | |
| 5,818,254 A | 10/1998 | Agrawal et al. | |
| 5,821,794 A | 10/1998 | Nazarian et al. | |
| 5,825,226 A | 10/1998 | Ferraiolo et al. | |
| 5,848,285 A | 12/1998 | Kapusta et al. | |
| 5,875,219 A | 2/1999 | Kim | |
| 5,933,023 A | 8/1999 | Young | |
| 5,966,027 A | 10/1999 | Kapusta et al. | |
| 5,977,791 A | 11/1999 | Veenstra | |
| 6,043,677 A | 3/2000 | Albu et al. | |
| 6,049,223 A | 4/2000 | Lytle et al. | |
| 6,049,225 A | 4/2000 | Huang et al. | |
| 6,054,887 A | 4/2000 | Horie et al. | |
| 6,058,452 A | 5/2000 | Rangasayee et al. | |
| 6,066,990 A | 5/2000 | Genest | |
| 6,127,865 A | 10/2000 | Jefferson | |
| 6,130,552 A | 10/2000 | Jefferson et al. | |
| 6,134,181 A | 10/2000 | Landry | |
| 6,137,308 A | 10/2000 | Nayak | |
| 6,181,163 B1 | 1/2001 | Agrawal et al. | |
| 6,191,998 B1 | 2/2001 | Reddy et al. | |
| 6,201,407 B1 | 3/2001 | Kapusta et al. | |
| 6,271,679 B1 | 8/2001 | McClintock et al. | |
| 6,272,646 B1 | 8/2001 | Rangasayee et al. | |
| 6,690,224 B1 | 2/2004 | Moore | |
| 6,864,710 B1 | 3/2005 | Lacey et al. | |
| 7,536,580 B2 * | 5/2009 | Miyazaki | 713/502 |

OTHER PUBLICATIONS

Lee, H.-i. et al., "A Σ-Δ Fractional-$N$ Frequency Synthesizer Using a Wide-Band Integrated VCO and a Fast AFC Technique for GSM/GPRS/WCDMA Applications," IEEE Journal of Solid-State Circuits, vol. 39, No. 7, Jul. 2004, pp. 1164-1169.

Cypress Semiconductor Corporation, Preliminary "WirelessUSB PRoC Flash Programmable MCA + Radio," CYWUSB6953, Mar. 2005, Document #38-16017 Rev. **, pp. 1-7; 7 pages.

USPTO Notice of Allowance for U.S. Appl. No. 09/893,161 dated Sep. 23, 2003; 6 pages.

USPTO Non-Final Rejection for U.S. Appl. No. 09/893,161 dated Jun. 18, 2003; 9 pages.

Cypress Semiconductor Corporation, RoboClockII CY7B994V/CY7B993V, "High-Speed Multi-Phase PLL Clock Buffer," Mar. 2001, pp. 1-14; 14 pages.

USPTO Notice of Allowance for U.S. Appl. No. 09/475,879 dated Oct. 22, 2004; 7 pages.

USPTO Advisory Action for U.S. Appl. No. 09/475,879 dated Mar. 4, 2002; 3 pages.

USPTO Advisory Action for U.S. Appl. No. 09/475,879 dated Dec. 31, 2001; 3 pages.

USPTO Final Rejection for U.S. Appl. No. 09/475,879 dated Oct. 11, 2001; 10 pages.

USPTO Non-Final Rejection for U.S. Appl. No. 09/475,879 dated Mar. 8, 2001; 6 pages.

Heile et al., "Hybrid Product Term and LUT Based Architecture Using Embedded Memory Blocks," Proceedings of FPGA 1999 Conference, Feb. 1999, pp. 13-16; 4 pages.

"Vertex 2.5V Field Programmable Gate Arrays," Xilinx, Apr. 2001, pp. 1-20; 20 pages.

"XC4000XLA/XV Field Programmable Gate Arrays," Xilinx, Oct. 1999, pp. 6-157 to 6-170; 14 pages.

"Coolrunner XPLA3 CPLD," Xilinx Advance Product Specification DS012 (v1.4), Apr. 2001, pp. 1-10; 10 pages.

"Spartan and Spartan-XL Families Field Programmable Gate Arrays," Xilinx, Mar. 2000, pp. 4-1 to 4-66; 66 pages.

"XC9500XV Family High-Performance CPLD," Xilinx, Jan. 2001, pp. 1-18; 18 pages.

"Integrating Product-Term Logic in APEX 20K Devices," Altera, Apr. 1999, Version 1.0, pp. 1-12; 12 pages.

"APEX II Programmable Logic Device Family," Altera, May 2001, Version 1.1, pp. 1-96; 96 pages.

"Flex 8000 Programmable Logic Device Family," Altera, Jun. 1999, Version 10.01, pp. 349-410; 62 pages.

"Max 7000 Programmable Logic Device Family," Altera, Mar. 2001, Version 6.1, pp. 1-62; 62 pages.

"Max 9000 Programmable Logic Device Family," Altera, Jul. 1999, Version 6.01, pp. 1-40; 41 pages.

"Flex 10K Embedded Programmable Logic Device Family," Altera, Mar. 2001, Version 4.1, pp. 1-128; 128 pages.

"Mach 5 CPLD Family - Fifth Generation Mach Architecture," Lattice Semiconductor Corp., Revision 1, Sep. 2000, pp. 1-48; 48 pages.

USPTO Notice of Allowance for U.S. Appl. No. 08/587,659 dated Nov. 12, 1997; 1 page.

USPTO Non-Final Rejection for U.S. Appl. No. 08/587,659 dated Jun. 13, 1997; 5 pages.
USPTO Notice of Allowance for U.S. Appl. No. 08/626,043 dated Feb. 11, 1998; 6 pages.
USPTO Non-Final Rejection for U.S. Appl. No. 08/626,043 dated Aug. 26, 1997; 7 pages.
USPTO Notice of Allowance for U.S. Appl. No. 08/707,694 dated Mar. 1, 2001; 1 page.
USPTO Final Rejection for U.S. Appl. No. 08/707,694 dated Dec. 13, 2000; 8 pages.
USPTO Non-Final Rejection for U.S. Appl. No. 08/707,694 dated Jun. 27, 2000; 7 pages.
USPTO Advisory Action for U.S. Appl. No. 08/707,694 dated May 1, 2000; 1 page.
USPTO Final Rejection for U.S. Appl. No. 08/707,694 dated Feb. 1, 2000; 9 pages.
USPTO Non-Final Rejection for U.S. Appl. No. 08/707,694 dated Dec. 2, 1997; 8 pages.
USPTO Notice of Allowance for U.S. Appl. No. 08/549,915 dated Apr. 8, 1997; 3 pages.
USPTO Non-Final Rejection for U.S. Appl. No. 08/549,915 dated May 24, 1996; 3 pages.
USPTO Notice of Allowance for U.S. Appl. No. 08/578,478 dated Sep. 22, 1997; 1 page.
USPTO Non-Final Rejection for U.S. Appl. No. 08/578,478 dated Jun. 24, 1997; 3 pages.
USPTO Notice of Allowance for U.S. Appl. No. 08/578,094 dated Jun. 25, 1998; 1 page.
USPTO Final Rejection for U.S. Appl. No. 08/578,094 dated Apr. 10, 1998; 4 pages.
USPTO Non-Final Rejection for U.S. Appl. No. 08/578,094 dated Oct. 8, 1997; 4 pages.
USPTO Notice of Allowance for U.S. Appl. No. 08/940,437 dated Feb. 17, 1999; 2 pages.
USPTO Notice of Allowance for U.S. Appl. No. 09/257,468 dated May 24, 2000; 3 pages.
USPTO Final Rejection for U.S. Appl. No. 09/257,468 dated Mar. 14, 2000; 5 pages.
USPTO Non-Final Rejection for U.S. Appl. No. 09/257,468 dated Nov. 2, 1999; 4 pages.
USPTO Notice of Allowance for U.S. Appl. No. 09/009,569 dated Mar. 21, 2000; 3 pages.
USPTO Non-Final Rejection for U.S. Appl. No. 09/009,569 dated Nov. 16, 1999; 7 pages.
USPTO Non-Final Rejection for U.S. Appl. No. 09/009,569 dated Jun. 18, 1999; 7 pages.
USPTO Final Rejection for U.S. Appl. No. 08/946,030 dated Mar. 6, 2000; 4 pages.
USPTO Non-Final Rejection for U.S. Appl. No. 08/946,030 dated Nov. 12, 1999; 3 pages.
USPTO Advisory Action for U.S. Appl. No. 08/946,030 dated Oct. 4, 1999; 1 page.
USPTO Final Rejection for U.S. Appl. No. 08/946,030 dated Jul. 19, 1999; 5 pages.
USPTO Non-Final Rejection for U.S. Appl. No. 08/946,030 dated Mar. 31, 1999; 4 pages.
USPTO Notice of Allowance for U.S. Appl. No. 07/429,850 dated Jan. 15, 1991; 2 pages.
USPTO Final Rejection for U.S. Appl. No. 07/429,850 dated Aug. 29, 1990; 4 pages.
USPTO Non-Final Rejection for U.S. Appl. No. 07/429,850 dated Jan. 25, 1990; 2 pages.
USPTO Notice of Allowance for U.S. Appl. No. 07/241,015 dated Jul. 18, 1989; 1 page.
USPTO Notice of Allowance for U.S. Appl. No. 08/550,165 dated Dec. 6, 1996; 1 page.
USPTO Non-Final Rejection for U.S. Appl. No. 08/550,165 dated Sep. 17, 1996; 4 pages.
Agrawal et al., "An Innovative, Segmented High Performance FPGA Family with Variable-Grain-Architecture and Wide-Gating Functions," Vantis Corporation, Feb. 1999, pp. 17-26; 10 pages; Proceedings of the 1999 ACM/SIGDA Seventh International Symposium on Field Programmable Gate Arrays.
Xilinx, "XC4000 Field Programmable Gate Arrays," Product Specification, Version 1.04, Sep. 18, 1996; pp. 4-5 through 4-180; 145 pages.
Kaptanoglu et al., "A New High Density and Very Low Cost Reprogrammable FPGA Architecture," Actel Corporation, BTR Inc., Feb. 1999, 10 pages; Proceedings of the 1999 ACM/SIGDA Seventh International Symposium on Field Programmable Gate Arrays; pp. 3-12.

* cited by examiner

SYSTEM AND METHOD OF LOADING A PROGRAMMABLE COUNTER

REFERENCE TO PRIOR APPLICATIONS

This application claims the benefit of U.S. Provisional Application No. 60/992,011, filed Dec. 3, 2007.

TECHNICAL FIELD

This disclosure relates generally to loading programmable counters and in particular but not exclusively, relates to loading a programmable counter of a Phase-Locked Loop (PLL).

BACKGROUND INFORMATION

Frequency-hopping spread spectrum ("FHSS") is widely used in communication systems, in which PLLs may provide frequency stability and accuracy. However, PLLs may require a significant amount of settling/locking time to tune to a desired frequency channel.

Furthermore, when designing a communication application, the battery life is a key design parameter. One solution to extend the battery life of the communication application may be by periodically entering a "sleep" mode, in which many system components power down. However, the responsiveness of the communication application may be significantly compromised, because upon "awakening" from the sleep mode, the communication application may perform a complete resynchronization procedure to resume communication with the rest communication system. This resynchronization procedure may increase the frequency settling and locking time of the PLLs. Other solutions may include continuously maintaining synchronization, at the expense of decreased battery life.

BRIEF DESCRIPTION OF THE DRAWINGS

Non-limiting and non-exhaustive embodiments of the invention are described with reference to the following figures, wherein like reference numerals refer to like parts throughout the various views unless otherwise specified.

DETAILED DESCRIPTION

Embodiments of a system and method of loading a programmable counter are described herein. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1:
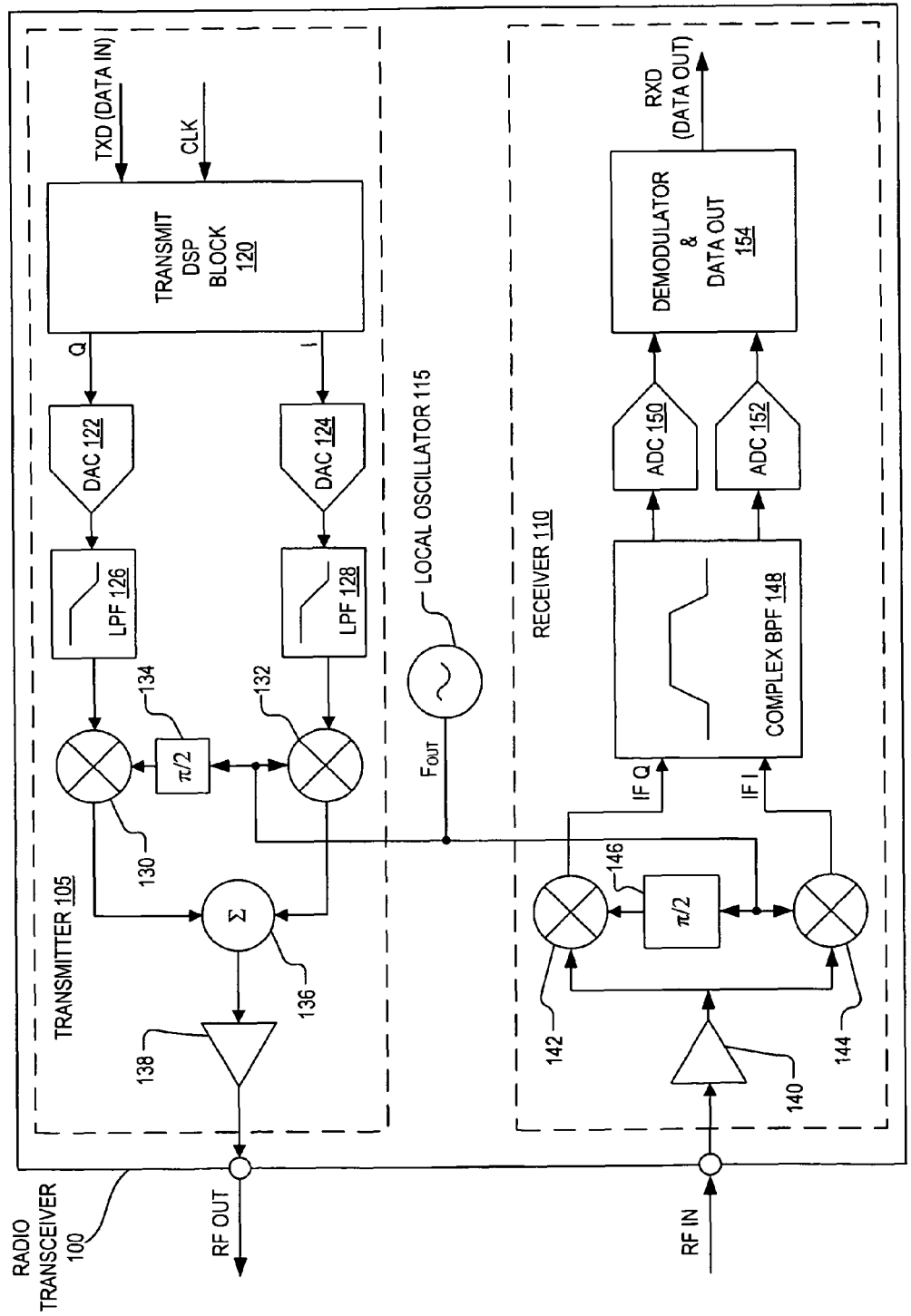
FIG. 1 is a schematic block diagram illustrating an example radio transceiver in accordance with an embodiment of the invention.

FIG. 1 is a schematic block diagram illustrating an example radio transceiver 100 in accordance with an embodiment of the invention. In general, radio transceiver 100 includes three main components: a transmitter 105 to modulate, up-convert, and amplify signals for transmission into free space; a receiver 110 to detect signals in the presence of noise and interference, and provide amplification, down-conversion and demodulation of the detected signal, and a local oscillator (LO) generator 115 or frequency synthesizer to generate a frequency output signal to both the transmitter and the receiver. Local oscillator 115 may include one or more phase-locked loops (discussed below) to provide frequency stability and accuracy.

The illustrated embodiment of transmitter 105 includes a transmit digital signal processor (DSP) block 120, digital-to-analog converters (DAC) 122 and 124, low-pass filters 126 and 128, mixers 130 and 132, a phase shifter 134, a summing block 136, and an amplifier/buffer 138. Receiver 110 is illustrated as including an amplifier/buffer 140, mixers 142 and 144, a phase shifter 146, a complex band pass filter (BPF) 148, analog-to-digital converters (ADC) 150 and 152, and a demodulator and data out block 154.

Figure 2:
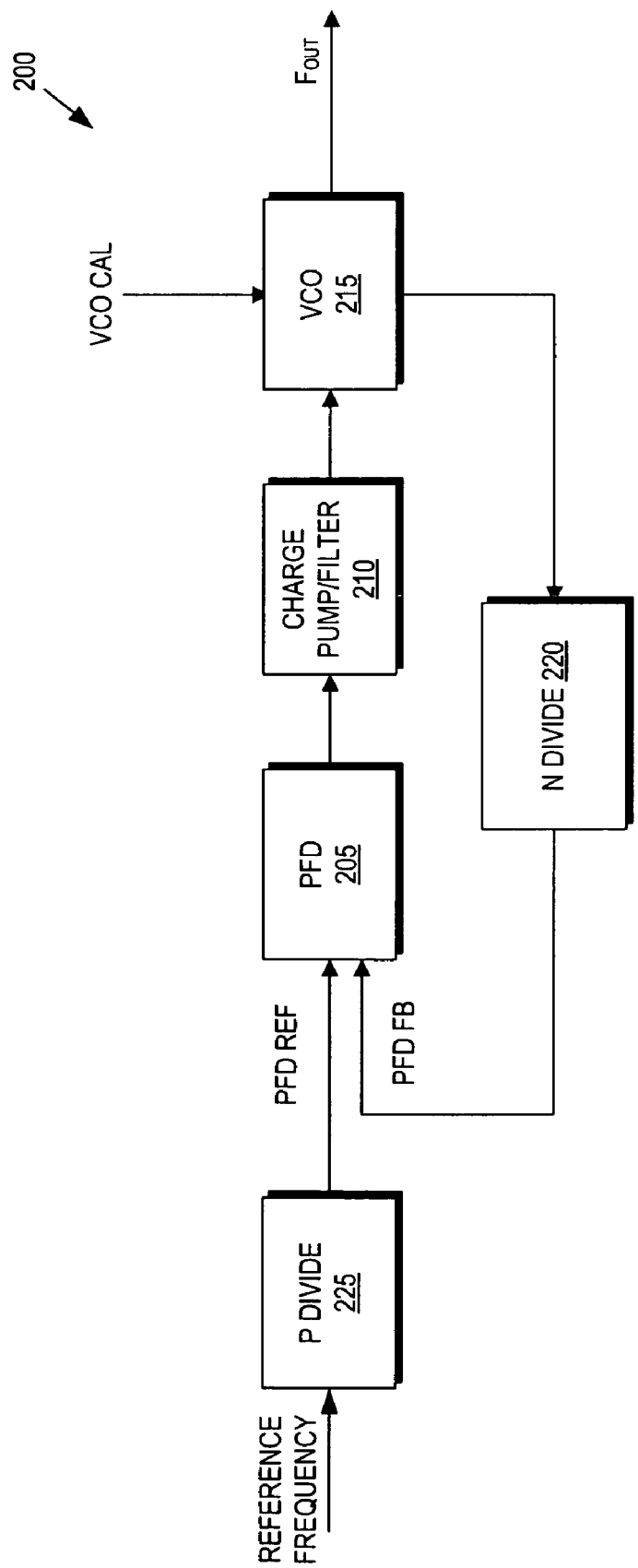
FIG. 2 is a block diagram illustrating a PLL architecture.

FIG. 2 is a block diagram illustrating a PLL architecture 200. Referring to FIG. 2, PLL 200 includes a phase frequency detector (PFD) 205, a charge pump/filter 210, a voltage controlled oscillator (VCO) 215, and dividers 220 and 225. PFD 205 sends information about the frequency and phase of the PFD reference signal relative to the PFD feedback signal to the charge pump/filter 210. Charge pump/filter 210 integrates the filter information into a voltage. VCO 215 converts the voltage from charge pump/filter 210 into an output frequency $f_{out}$, which is then provided to a transmitter and/or receiver.

Divider 220 divides down the higher speed frequency $f_{out}$ from VCO 215 for a comparison to the PFD reference signal by the PFD 205. Divider 225 divides an input frequency (e.g., from a crystal oscillator) before being presented to the PFD 205. In addition, a VCO calibration value may be loaded into the VCO 215 to calibrate the VCO frequency.

Figure 3:
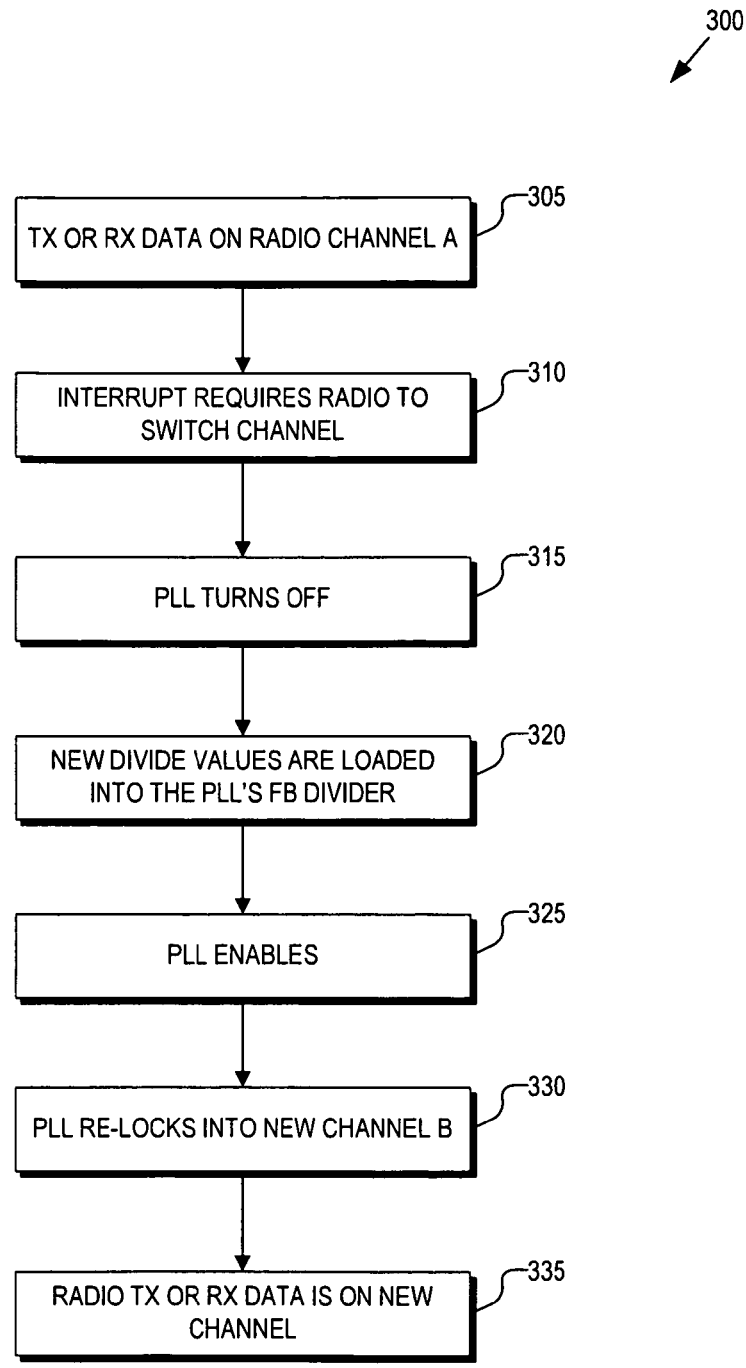
FIG. 3 is a flow diagram illustrating a PLL re-lock technique.

FIG. 3 is a flow diagram illustrating a PLL re-lock technique 300. Referring to FIG. 3, data is transmitted and received in a communication channel A at 305. At 310, an interrupt is received to request switching channels. The PLL may be placed in a "sleep" mode or reset mode before acquiring a new channel, as indicated at 315, and upon awakening from the "sleep" mode, the PLL may perform a complete resynchronization procedure before it can re-lock into the new channel B. As such, PLL re-lock technique 300 may incur significant amount of settling/locking time when switching channels. At 320, a new divide value is loaded into the PLL's feedback divider. At 325, the PLL is enabled. At 330, the PLL re-locks into a new channel B. At 335, the radio transmits and/or receives on the new channel (i.e., channel B).

Figure 4:
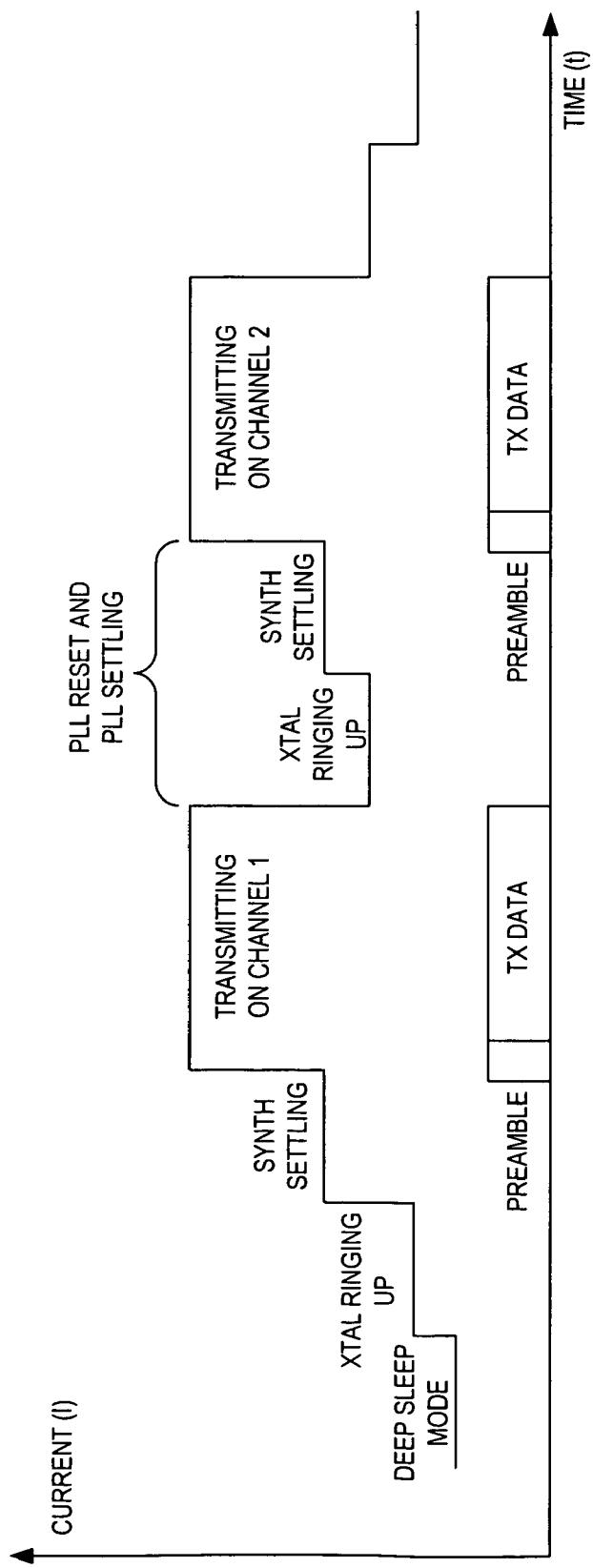
FIG. 4 is a timing sequence diagram illustrating a PLL settling time of the PLL re-lock technique of FIG. 3.

FIG. 4 illustrates a PLL settling time of PLL re-lock technique 300 of FIG. 3. The Y-axis of FIG. 4 represents the amount of current consumption as a function of time associated with each communication event. As can be seen from FIG. 4, a significant amount of current may be consumed during PLL reset and settling events before transmitting may occur on a new channel (i.e., channel 2).

Figure 5:
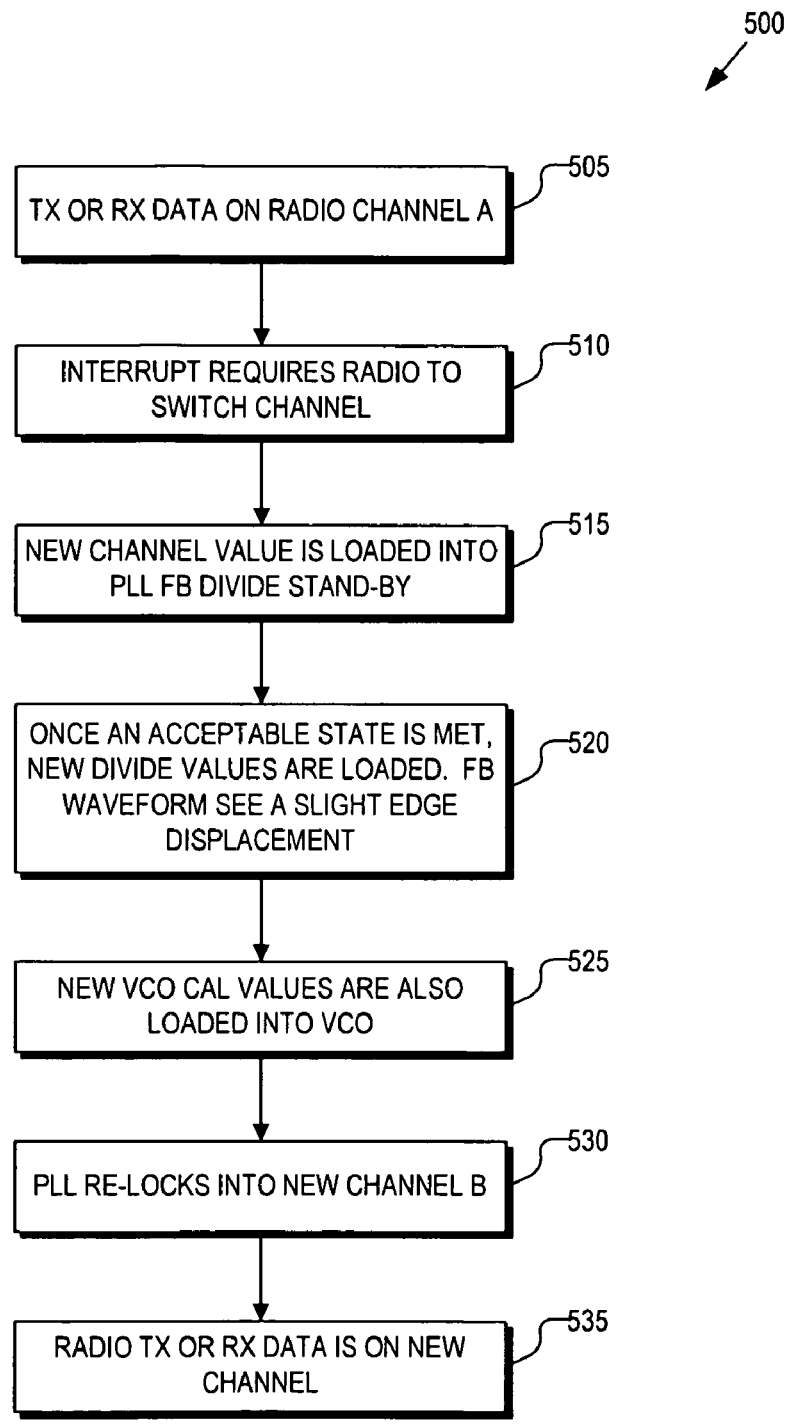
FIG. 5 is a flow diagram illustrating an example PLL re-lock technique in accordance with an embodiment of the invention.

FIG. 5 is a flow diagram illustrating an example PLL re-lock technique 500 in accordance with an embodiment of the invention. Referring to FIG. 5, at 505, data is transmitted and/or received on a communication channel A. At 510, an interrupt is received to switch to a new channel. At 515, the new channel value is loaded into a PLL feedback divider stand-by, e.g. a register, to temporarily store the new channel value. At 520, once an acceptable state is met, a new divide value associated with the new channel value is loaded into the PLL feedback divider. The acceptable state may refer to a clock state in which the PLL is locked into the current channel, and thus the feedback divide frequency (i.e., PFD FB signal) is substantially synchronized with the reference frequency (i.e., PFD REF signal).

At 525, a new VCO CAL value may be loaded into the VCO. Although FIG. 5 shows that the new VCO value is loaded after the new divide value is loaded, the VCO calibration value may be loaded into the VCO before the new divide value is loaded. Alternatively, the new VCO value may be loaded simultaneously as the new divide value is loaded. At 530, the PLL re-locks into the new channel. At 535, data is transmitted and/or received on the new channel. Since the new divide value is loaded after the PLL reaches a phase-locked state, the feedback waveform may only see a slight edge displacement from the reference waveform, and thus the PLL may quickly re-lock into the new channel.

The above-described PLL re-lock technique 500 may be referred as a clean "on-the-fly" PLL. "Clean" means gentle edge displacement of the feedback waveform, while "on-the-fly" refers to the condition in which the PLL can be reprogrammed during running without significantly disturbing the functionality of the PLL. The clean "on-the-fly" PLL allows for quick locking/settling into a new channel as compared to PLL re-lock technique 300 of FIG. 3. Fast frequency settling/locking reduces channel-hopping time, allowing for greater throughput in FHSS systems. Furthermore, fast channel-hopping incurs relatively little current consumption, and thus long battery life for communication applications.

Figure 6:
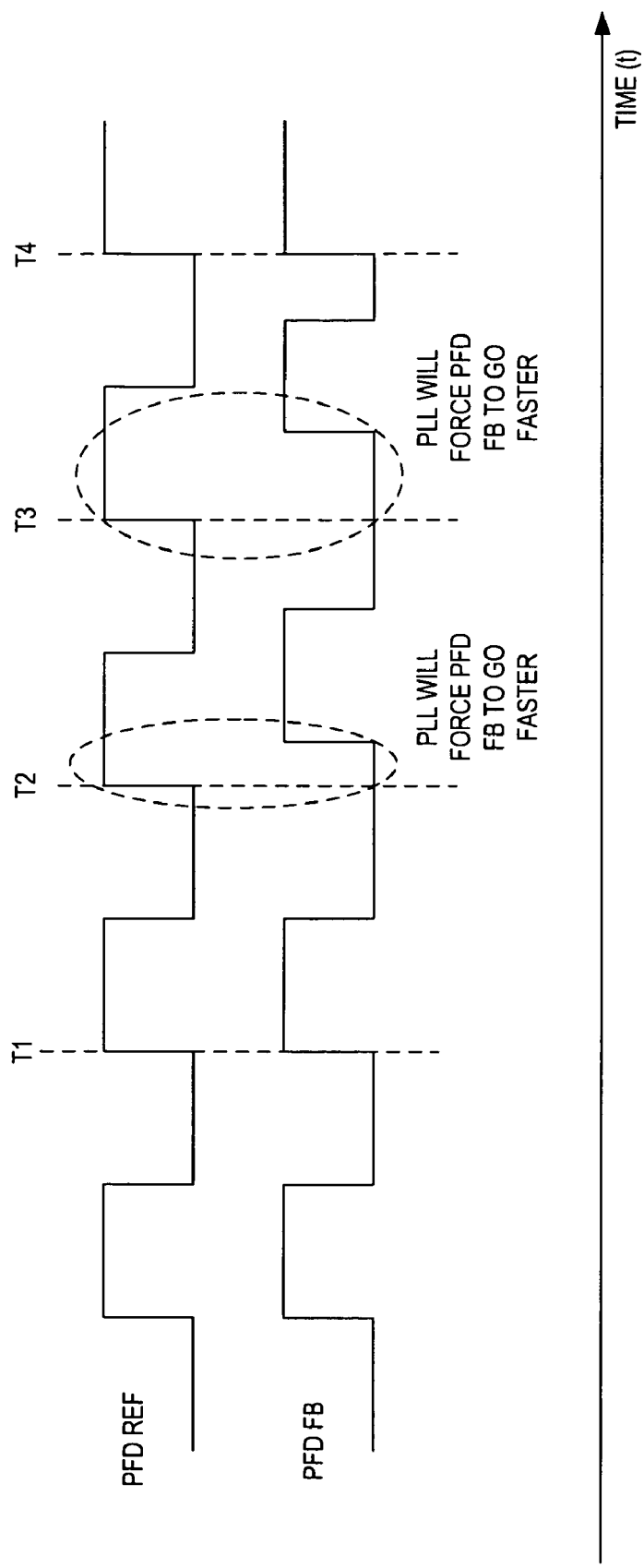
FIG. 6 is a waveform further illustrating the PLL re-lock technique of FIG. 5.

FIG. 6 is a waveform further illustrating PLL re-lock technique 500 of FIG. 5. Referring to FIG. 6, at time T1, the rising edges of the reference waveform (i.e., PFD REF signal) and the feedback waveform (i.e., PFD FB signal) occurs simultaneously. This is a phase-locked condition. At time T2 and T3, the rising edge of the reference waveform occurs before the rising edge of the feedback waveform. This small edge disturbance may be caused by the "on-the-fly" programming.

Without the "on-the-fly", the edge disturbance may be much greater. A phase detector (PFD), such as PFD 205 of FIG. 2, may be configured to speed up a VCO, such as VCO 215 of FIG. 2, by changing the control voltage of the VCO, resulting in some phase compensation. Since there is only a slight edge delay of the feedback waveform at T2 and T3, the PLL may quickly re-lock into a new channel. At time T4, the rising edges of the reference waveform and the feedback waveform occur simultaneously, indicating a phase-locked condition in the new channel.

Figure 7:
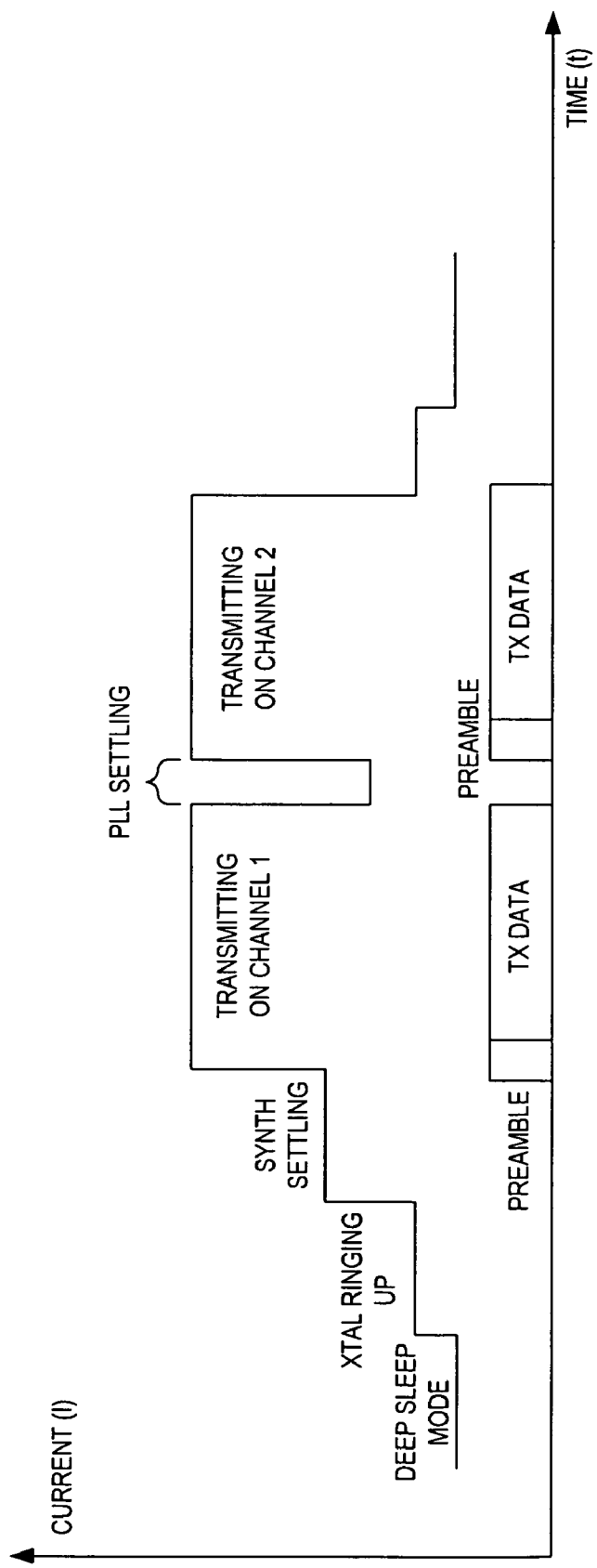
FIG. 7 is a timing sequence diagram further illustrating the PLL re-lock technique of FIG. 5.

FIG. 7 is a timing sequence diagram further illustrating PLL re-lock technique 500 of FIG. 5. As shown in FIG. 7, the PLL settling time is relatively short as compared to the settling time of PLL re-lock technique 300, such as that shown in FIG. 4. In some embodiments, the PLL settling time may be on the order of 1500 or less, which meets requirements for certain communication applications.

Figure 8A:
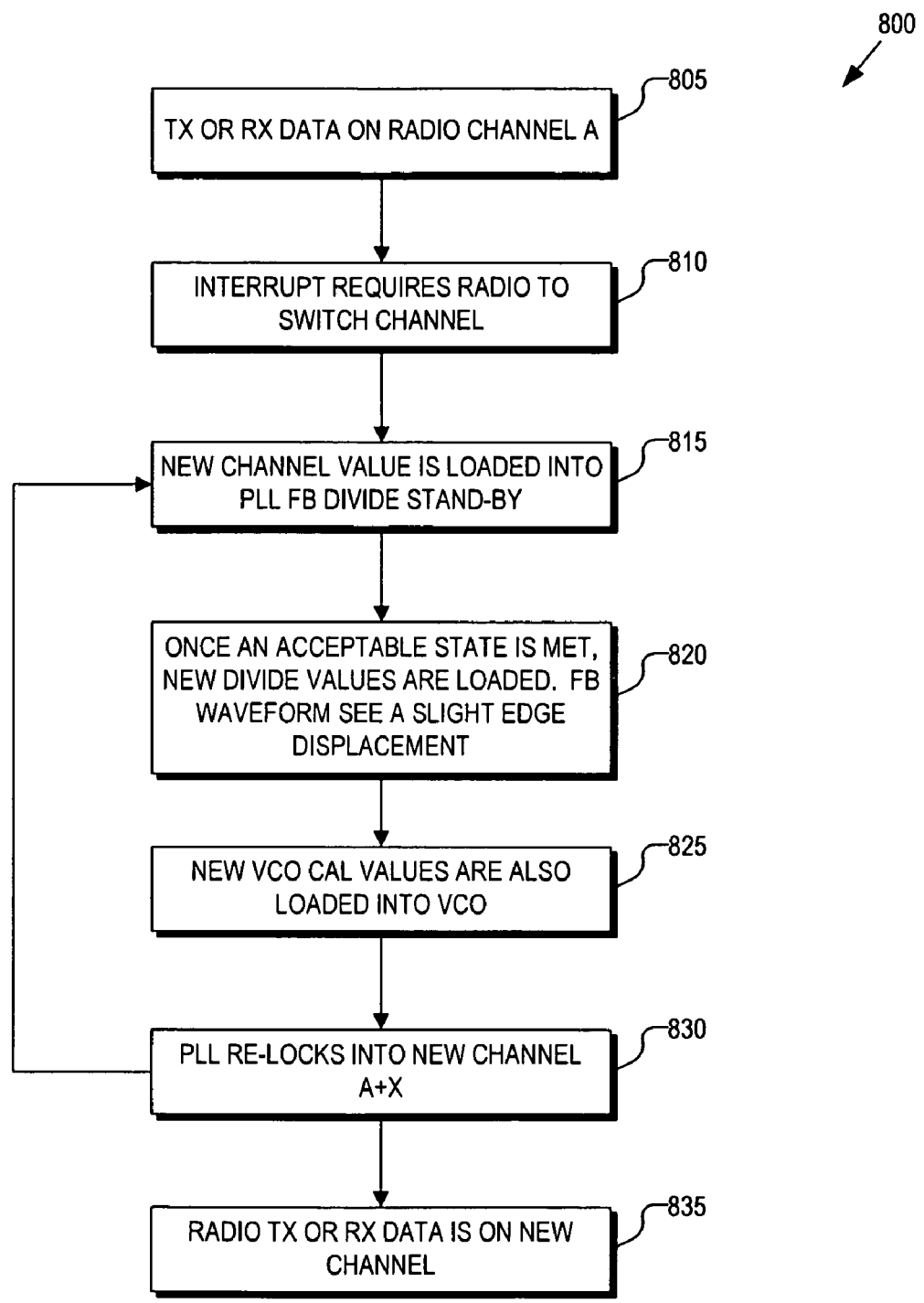
FIG. 8A is a flow diagram illustrating an example PLL re-lock technique in accordance with an embodiment of the invention.
Figure 8B:
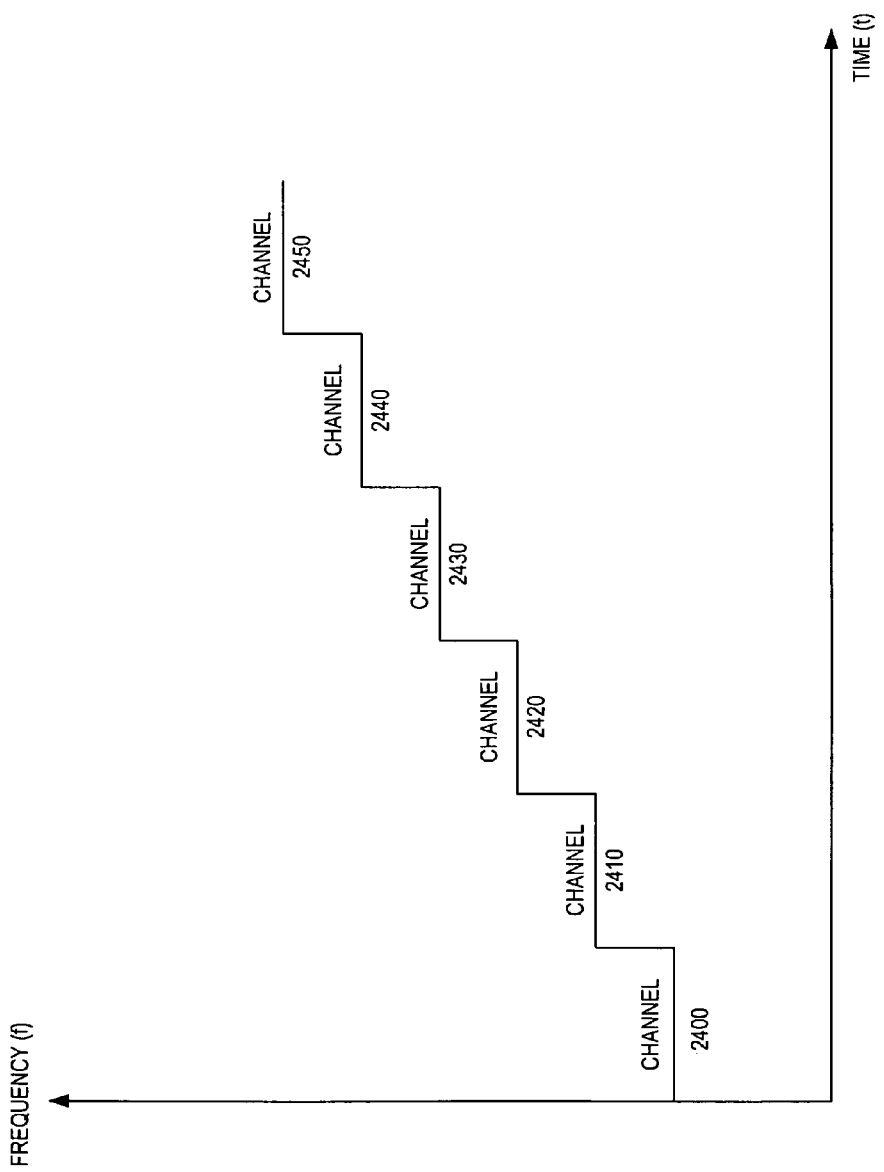
FIG. 8B is a waveform further illustrating the PLL re-lock technique of FIG. 8A.

FIG. 8A is a flow diagram illustrating an example PLL re-lock technique 800 in accordance with an embodiment of the invention. FIG. 8B is a waveform further illustrating PLL re-lock technique 800 of FIG. 8A. PLL re-lock technique 800 is similar to that described in FIG. 5, but instead of using large frequency jumps, multiple small frequency jumps may be used to switch channels. For example, as shown in FIG. 8B, when switching from channel 2400 to channel 2450, multiple small jumps 2400, 2410, 2420, 2430, 2440, and 2450 may be implemented according to FIG. 8A.

Referring to FIG. 8A, at 805, data is transmitted and/or received on a communication channel A. At 810, an interrupt is received to require switching to a new channel B, e.g., channel 2450. At 815, a new channel value is loaded into a PLL feedback divider stand-by, e.g., a register, to temporarily store the new channel value. This new channel value may represent one of the incremental channel jumps, e.g., 2410, 2420, 2430, or 2440. At 820, once an acceptable state is met, a new divide value associated with the new channel value is loaded into the PLL feedback divider. The acceptable state may refer to the condition in which the PLL is phased-locked in the current channel, and thus the feedback divide frequency is substantially synchronized with the reference frequency.

At 825, a new VCO calibration value may be loaded into the VCO. Although FIG. 8A shows that the new VCO value is loaded after the new divide value is loaded, the VCO calibration value may be loaded into the VCO before the new divide value is loaded. Alternatively, the new VCO value may be loaded simultaneously as the new divide value is loaded. At 830, the PLL re-locks into the new channel. If the new channel is not channel B, blocks 815-830 are repeated. Otherwise, data is transmitted and/or received on channel B at 835. Since the new divide value is loaded after the PLL has reached a phase-locked condition, the feedback waveform may only see a slight edge displacement from the reference waveform. As a result, the PLL may quickly re-lock into the new channel.

Figure 9:
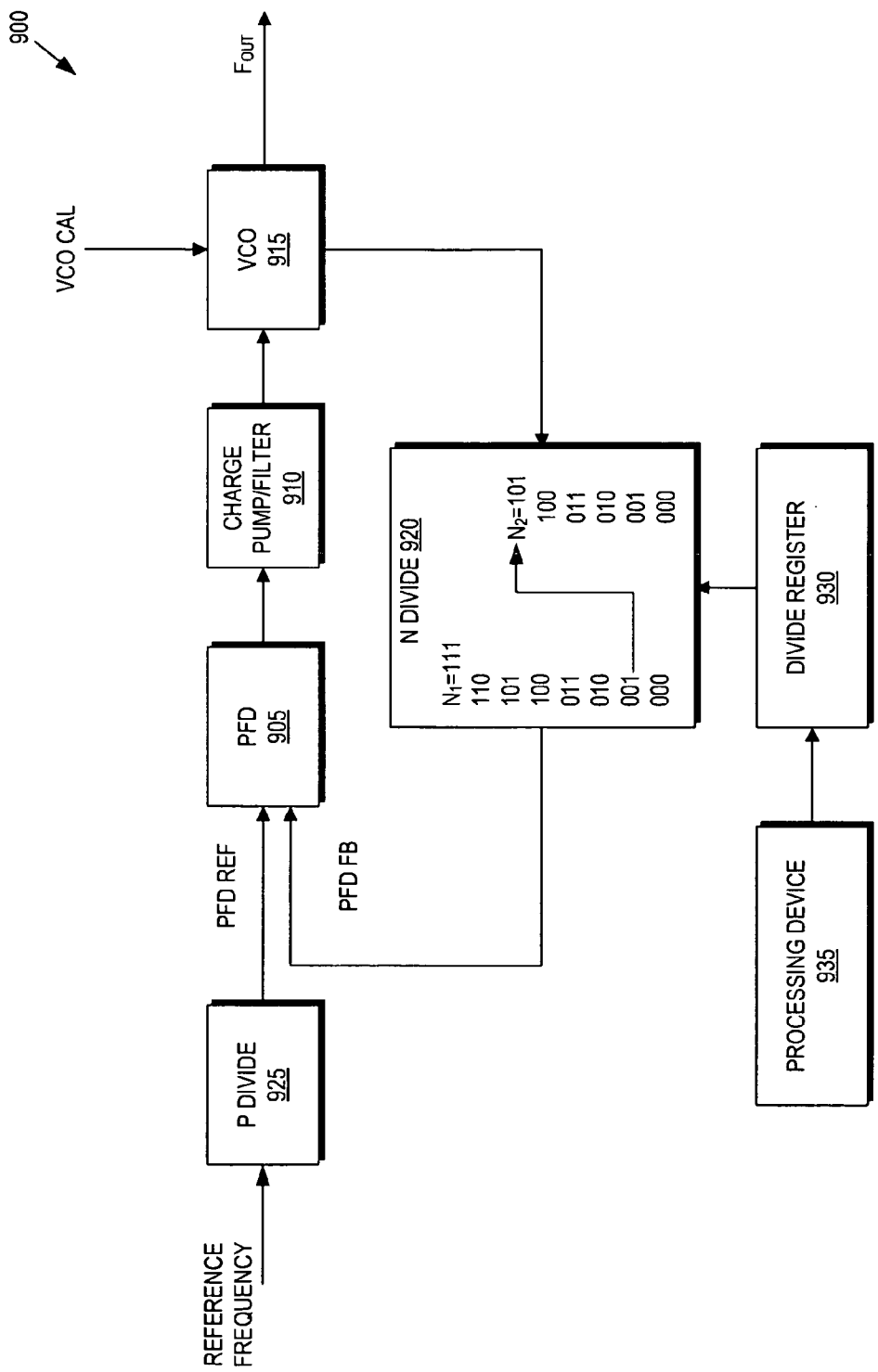
FIG. 9 is a block diagram illustrating an example PLL architecture in accordance with an embodiment of the invention.

FIG. 9 is a block diagram illustrating an example PLL architecture 900 in accordance with an embodiment of the invention. Referring to FIG. 9, PLL 900 includes a phase frequency detector (PFD) 905, a charge pump/filter 910, a voltage controlled oscillator (VCO) 915, and dividers 920 and 925. FIG. 9 further illustrates a processing device 935 and divide register 930 coupled to divider 920. PFD 905 sends information about the frequency and phase of the reference signal (i.e., PFD REF signal) relative to the feedback clock (i.e., PFD FB signal) to charge pump/filter 910. Charge pump/filter 910 integrates the filter information into a voltage. VCO 915 converts the voltage from charge pump/filter 910 into an output frequency $f_{out}$, which may then be provided to a transmitter and/or receiver.

Divider 920 divides down the higher speed frequency $f_{out}$ from the VCO 915 for a comparison to the reference signal by the PFD 905. Divider 925 divides an input frequency (e.g., a reference frequency signal from a crystal oscillator) before being presented to the PFD 905. Divider 920 may be implemented using a programmable counter, such as the N divide loading example shown in FIG. 9. The output frequency of the VCO 915 $f_{out}$ may be adjusted to a desired value by varying the value of N in the divider 920. For example, processing device 935 may write a divide value to divide register 930, where the divide value corresponds to a specific frequency to be output by VCO 915. Divide register 930 is coupled to store the divide value as needed for the programmable counter (e.g., divider 920). In addition, a VCO calibration value may be loaded into the VCO 915 to calibrate the VCO frequency.

Figure 10:
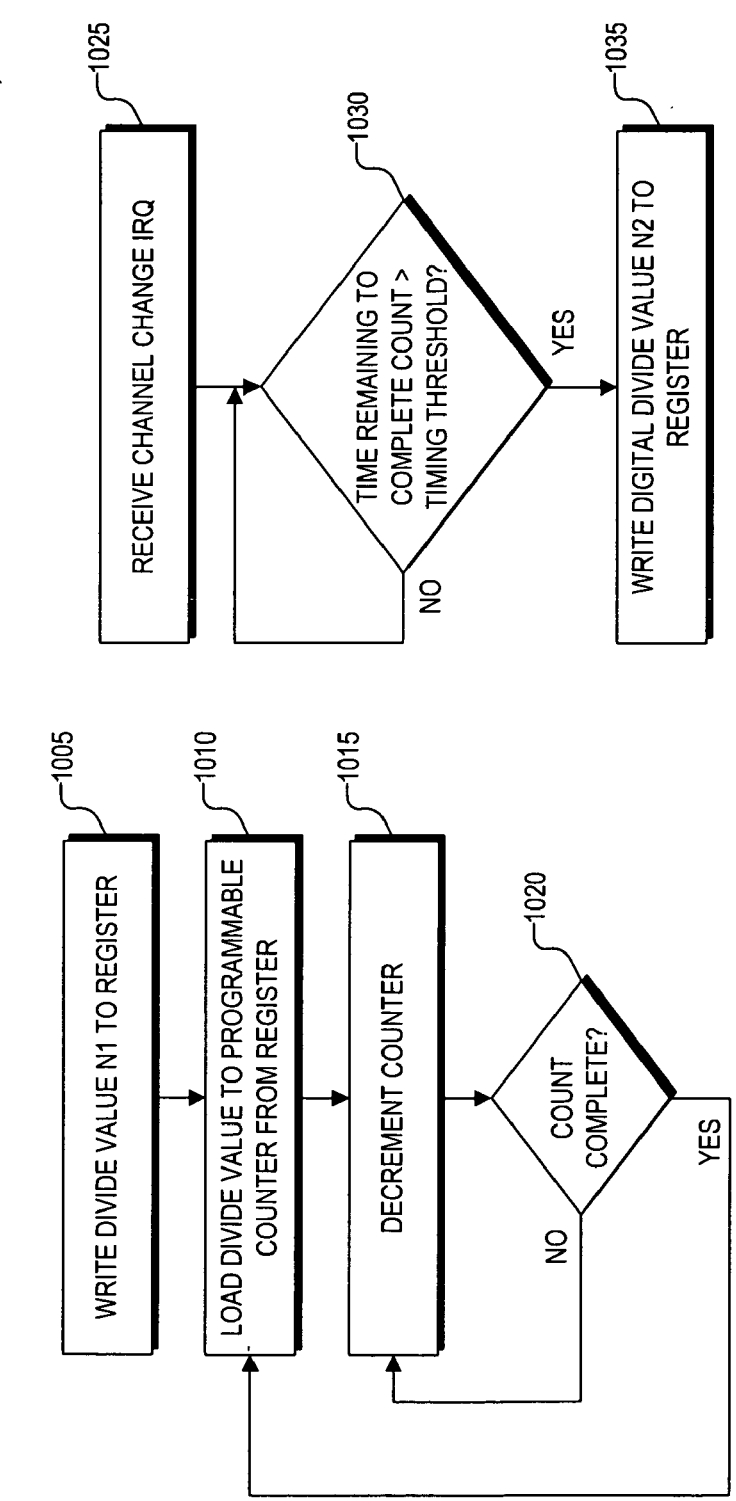
FIG. 10 is a flow diagram illustrating a PLL re-lock technique in accordance with an embodiment of the invention.

FIG. 10 is a flow diagram illustrating a PLL re-lock technique 1000 in accordance with an embodiment of the invention. PLL re-lock technique 1000 will be described with reference to FIGS. 9 and 10. At a process block 1005 processing device 935 may write a first digital divide value N1 to divide register 930. As discussed above, the digital divide value corresponds to a frequency to be output by PLL 900 (i.e., $F_{OUT}$) In a process block 1010 the digital divide value currently stored in divide register 930 is loaded into the programmable counter (i.e., divider 920). The programmable counter then decrements its count responsive to the frequency output signal $F_{OUT}$ in a process block 1015. In a decision block 1020 a determination is made as to whether a counting cycle has completed (e.g., programmable counter has counted a number of times equal to the digital divide value). If so, process 1000 proceeds back to process block 1010, where the digital divide value currently stored in divide register 930 is loaded into the programmable counter to restart the counting. If the counting cycle is not complete in decision block 1020, process 1000 repeats to process block 1015 to again decrement the count.

As PLL 900 operates, VCO 915 provides frequency output signal $F_{OUT}$ back to divider 920. Divider 920 divides the frequency of output signal $F_{OUT}$ by a number N (e.g., the currently loaded digital divide value). The output of the programmable counter (e.g., PFD feedback signal) is then fed back to PFD 905 for comparison with the PFD reference signal.

In one embodiment, any digital divide value that is currently stored in divide register 930 is loaded into the programmable counter upon completion of each counting cycle. Thus, processing device 935 may write a digital divide value to divide register 930 to change the count of the next counting cycle. However, processing device 935 and programmable counter 920 may operate asynchronously. That is, processing device 935 may operate at a clock speed that is independent and different that that of divider 920. Thus, the operation of PLL 900 may be drastically effected by the timing of when a divide value is written to divide register 930. For example, if processing device 935 were to be in the middle of writing a digital divide value to divide register 930 at the same time that the digital divide value were being loaded into divider 930, then the resultant value loaded into divider 920 may be unpredictable. This "glitch" in loading a digital divide value to divider 920 may result in longer or shorter counting cycles than desired. More importantly, the resultant edge displacement between the reference signal (e.g., PFD REF signal) and the feedback signal (e.g., PFD FB signal) may be large resulting in longer settling times and thus, greater current consumption by PLL circuit 900.

Accordingly, embodiments of the present invention provide a system and method of loading a programmable counter by writing a digital divide value to divide register 930 at a time that is responsive to a time remaining in the counting cycle of the programmable counter. It is in this manner that the writing of the digital divide value to divide register 930 can be completed before it is loaded into divider 920.

Still referring to FIGS. 9 and 10, an example interrupt service routine is described beginning at process block 1025. At process block 1025, processing device 935 receives an interrupt service request to change channels in the communications system. A new digital divide value N2 is then determined based on a frequency corresponding to the new channel requested in the interrupt request. Before processing device 935 writes the new digital divide value N2 to divide register 930, a determination is made (i.e., block 1030) as to whether there is enough time remaining in the current counting cycle to complete a writing of the new digital divide value N2 to divide register 930. In one embodiment, this may be accomplished by comparing the amount of time left in the current counting cycle to a timing threshold, where the timing threshold is greater than or equal to the amount of time needed to complete the writing of the digital divide value to the divide register. In one embodiment, processing device 935 may write digital divide value N2 to divide register 930 responsive to divider 920 completing a portion of its count. For example, processing device 935 may write to register 930 when the programmable counter completes half of its counting cycle.

If decision block 1030 determines that there is sufficient time remaining in the current counting cycle for processing device 935 to compete a write to divide register 930, then process 1000 proceeds to block 1035 where processing device 935 completes such a write operation. However, if there is insufficient time in decision block 1030 to complete a write to divide register 930 then process 1000 waits until there is sufficient time. That is, in one embodiment, processing device 935 may be forced to wait until a next counting cycle until the new digital divide value N2 is written to divide register 930.

Figure 11:
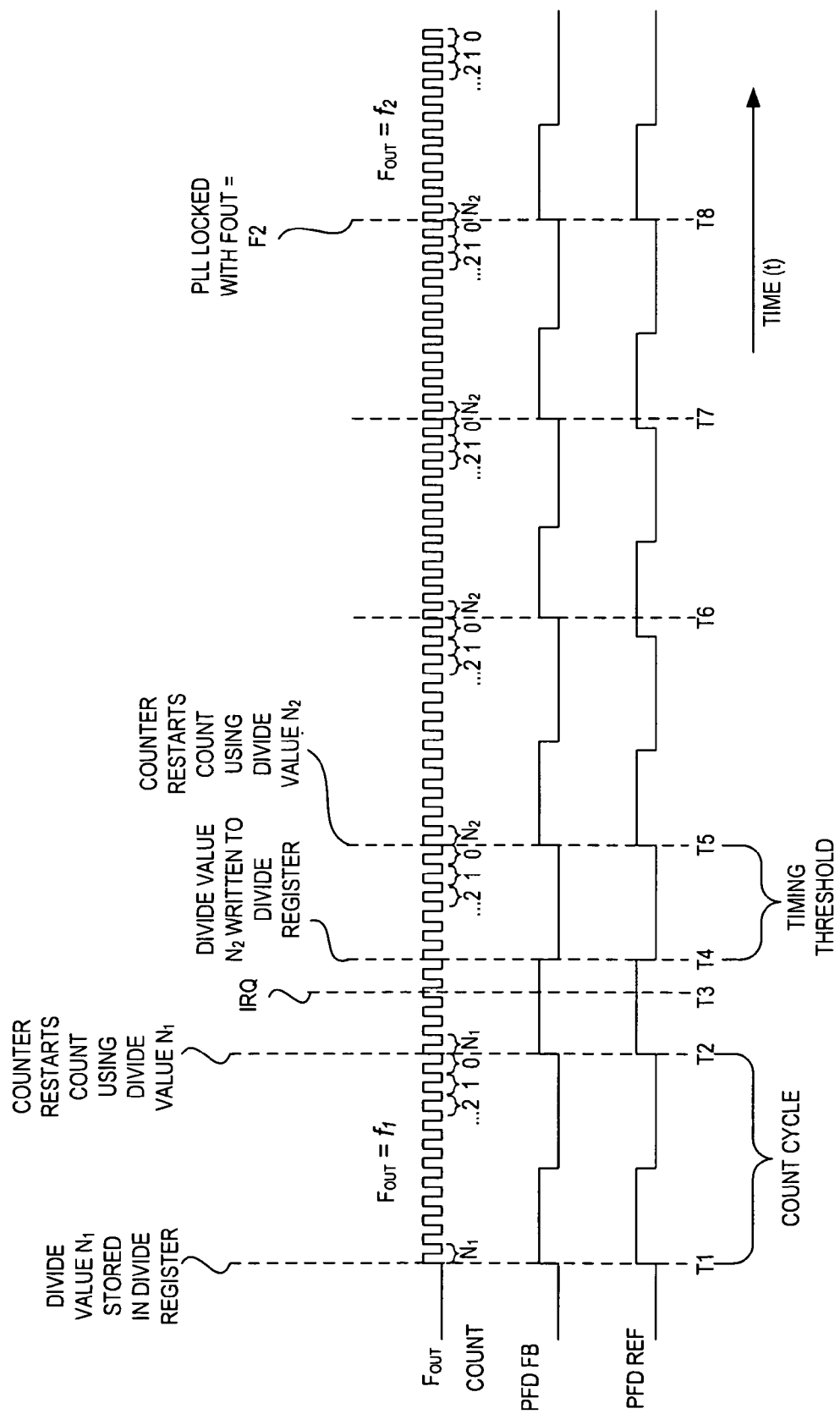
FIG. 11 is a timing sequence diagram further illustrating the PLL re-lock technique of FIG. 10.

FIG. 11 is a timing sequence diagram further illustrating the PLL re-lock technique of FIG. 10. As shown in FIG. 11, at time T1, PLL 900 is in a phase-locked condition and is providing an output frequency $F_{OUT}$ of $f_1$, which corresponds to a digital divide value of N1 being stored in divide register 930. At time T2, the programmable counter has completed a counting cycle. However, since digital divide value N1 is still stored in divide register 930, value N1 is again loaded into divide register 930 for another counting cycle using value N1.

As further shown in FIG. 11, an interrupt request (IRQ) is received at time T3 by processing device 935 to change channels. In the illustrated embodiment of FIG. 11 the timing threshold is equal to one-half of a period of the PFD feedback signal (time T5–time T4). Thus, in this embodiment, a transition from a high logic state to a low logic state of the PFD feedback signal may be used as a trigger for processing device 935 to begin a write operation to divide register 930. Accordingly, at time T4 a new digital divide value N2 is written to divide register 930. At time T5, digital divide value N2 is loaded to the programmable counter, which then begins a new count cycle using value N2. As shown in FIG. 11, by the time T8 occurs, PLL is back in a phase-locked state and is providing an output frequency $F_{OUT}$ of $f_2$.

Figure 12:
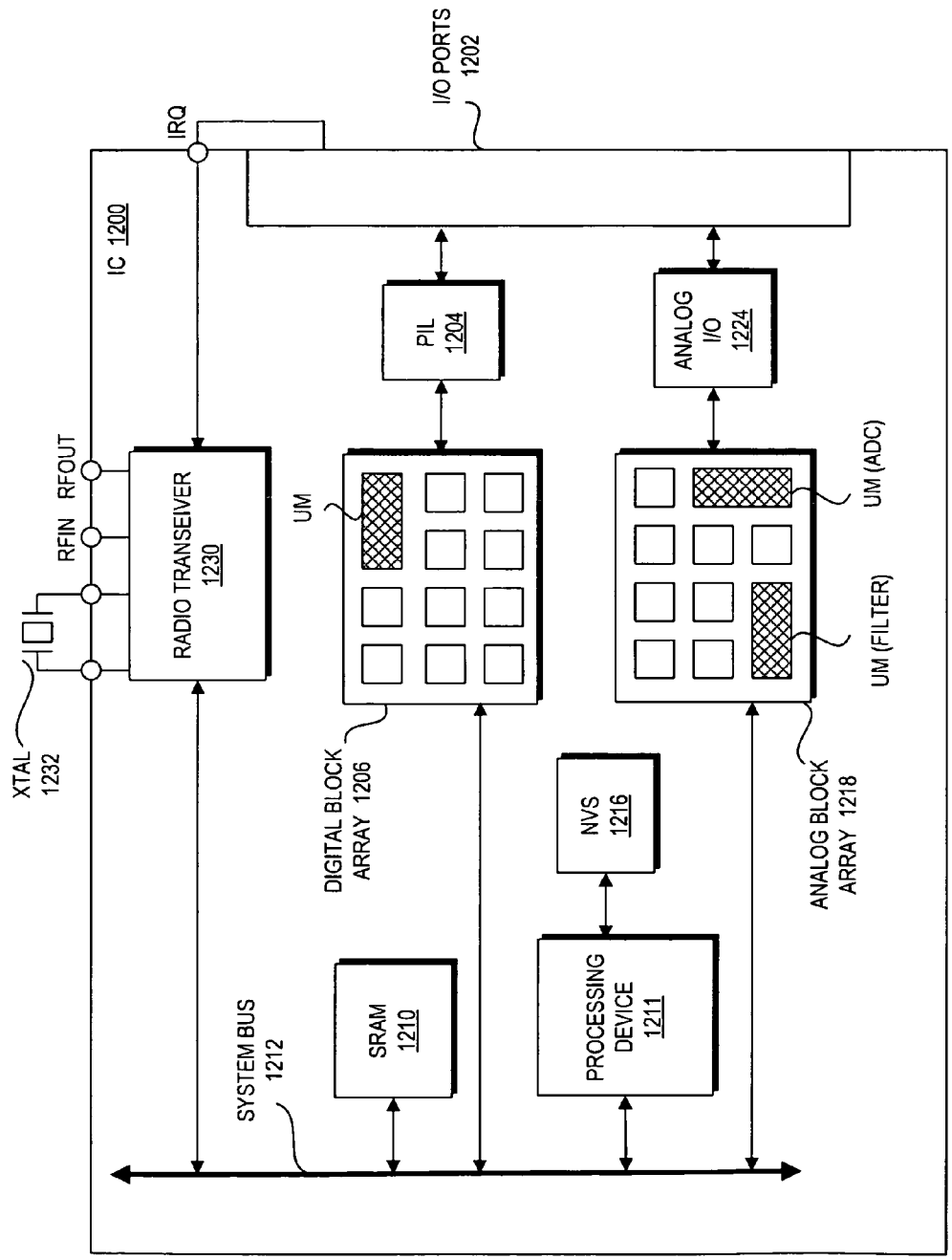
FIG. 12 is a functional block diagram illustrating a demonstrative system implemented with embodiments of the invention.

FIG. 12 is a functional block diagram illustrating a demonstrative integrated circuit (IC) 1200 implemented using an embodiment of PLL re-lock technique 500, 800 or 1000. IC 1200 may include a Programmable Radio on a Chip (PRoC™) microcontroller or a Programmable System on a Chip (PSoC™) microcontroller by Cypress Semiconductor Corporation. The illustrated embodiment of IC 1200 includes input/output ("I/O") ports 1202. I/O ports 1202 are coupled to Programmable Interconnect and Logic ("PIL") 1204 which acts as an interconnect between I/O ports 1202 and a digital block array 1206. Digital block array 1206 may be configured to implement a variety of digital logic circuits (e.g., DAC, digital filters, digital control systems, etc.) using configurable user modules ("UMs"). Digital block array 1206 is further coupled to a system bus 1212.

Static Random Access Memory ("SRAM") 1210 and processing device 1211 are also coupled to system bus 1212. Processing device 1211 is coupled to non-volatile storage ("NVS") 1216 which may be used to store firmware (e.g., control algorithms executable by processing device 1211 to implement process 500).

An analog block array 1218 is coupled to system bus 1212. Analog block array 1218 also may be configured to implement a variety of analog circuits (e.g., ADCs, analog filters, comparators, buffers, current sources, etc.) using configurable UMs. Analog block array 1218 is also coupled to an analog I/O unit 1224 which is coupled to I/O ports 1202.

As illustrated, radio transceiver 1230 is coupled to system bus 1212. IC 1200 may further include an IRQ, RFIN, RFOUT, and XTAL terminals. In one embodiment, the IRQ terminal may be coupled to I/O port 1202 to receive an interrupt request indicating that a channel change is requested. Furthermore, the illustrated embodiment of FIG. 12 further illustrates a crystal oscillator (e.g., XTAL 1232) coupled to radio transceiver 1230 to provide a reference frequency signal to, for example, PLL 900.

In one embodiment, radio transceiver 1230 is implemented as a Frequency-hopping spread spectrum ("FHSS") radio. In this embodiment, an interrupt request to change communications channel (e.g., block 1025 of process 100 in FIG. 10) may be in response to a request to change carrier frequencies during an FHSS communications exchange. In one embodiment, radio transceiver 1230 is implemented to receive or transmit RF communications in compliance with the Bluetooth™ protocol.

The order in which some or all of the process blocks appear in each process should not be deemed limiting. Rather, one of ordinary skill in the art having the benefit of the present disclosure will understand that some of the process blocks may be executed in a variety of orders not illustrated.

The processes explained above are described in terms of computer software and hardware. The techniques described may constitute processing device-executable instructions embodied within a processing device-readable medium, that when executed by a processing device will cause the processing device to perform the operations described. Additionally, the processes may be embodied within hardware, such as an application specific integrated circuit ("ASIC") or the like.

A medium readable by a processing device includes any mechanism that provides (e.g., stores) information in a form readable by a processing device (e.g., a computer, network device, personal digital assistant, manufacturing tool, any device with a set of one or more processors, etc.). For example, a processing device-readable medium includes recordable/non-recordable media (e.g., read only memory (ROM), random access memory (RAM), magnetic disk storage media, optical storage media, flash memory devices, network attached storage (NAS), etc.). In one embodiment, a medium readable by a processing device is a computer readable storage medium.

As described above, radio transceiver 100 or PLL 900 may be incorporated into IC 1200, as well as, various other integrated circuits. Descriptions of radio transceiver 100 or PLL 900 may be generated and compiled for incorporation into other integrated circuits. For example, behavioral level code describing PLL 900, or portions thereof, may be generated using a hardware descriptive language, such as VHDL or Verilog, and stored to a processing-readable medium. Furthermore, the behavioral level code can be compiled into register transfer level ("RTL") code, a netlist, or even a circuit layout and stored to a processing-readable medium. The behavioral level code, the RTL code, the netlist, and the circuit layout all represent various levels of abstraction to describe PLL 900.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. A method, comprising:
    storing a first digital divide value in a register;
    loading the first digital divide value from the register to a programmable counter; and
    writing a second digital divide value to the register at a time responsive to a time remaining to complete a counting cycle of the programmable counter.

2. The method of claim 1, further comprising loading the second digital divide value from the register to the programmable counter responsive to the programmable counter completing the counting cycle.

3. The method of claim 1, wherein writing the second digital divide value to the register includes determining whether the time remaining to complete the counting cycle of the programmable counter is greater than a timing threshold.

4. The method of claim 3, further comprising writing the second digital divide value to the register during a next counting cycle of the programmable counter if the time remaining to complete the counting cycle is less than the timing threshold.

5. The method of claim 3, wherein the timing threshold is greater than or equal to an amount of time to complete the writing of the second digital divide value to the register.

6. The method of claim 1, wherein the programmable counter is coupled in a loop with a phase frequency detector (PFD), a charge pump, and a voltage controlled oscillator (VCO) to form a phase-locked loop (PLL) circuit, wherein the method further comprises:
    dividing an output of the VCO by a currently loaded digital divide value with the programmable counter; and
    outputting a PFD feedback signal from the programmable counter to the PFD.

7. The method of claim 6, further comprising writing the second digital divide value to the register responsive to the PFD feedback signal changing logic states prior to a completion of the counting cycle.

8. The method of claim 1, wherein completing the counting cycle includes the programmable counter counting a number of times equal to the first digital divide value.

9. The method of claim 1, further comprising:
 dividing an output frequency of a phase-locked loop (PLL) circuit, with the programmable counter, wherein the PLL circuit is included in a local oscillator circuit of a radio transceiver; and
 providing the output frequency to a transmitter or receiver of the radio transceiver, wherein the output frequency is a first frequency when the programmable counter is counting the first digital divide value and wherein the output frequency is a second frequency when the programmable counter is counting the second digital divide value.

10. The method of claim 9, wherein the radio transceiver is included in a frequency-hopping spread spectrum radio.

11. A medium readable by a processing device, wherein the medium provides instructions that, when executed by the processing device, will cause the processing device to perform operations comprising:
 storing a first digital divide value in a register;
 loading the first digital divide value from the register to a programmable counter; and
 writing a second digital divide value to the register at a time responsive to a time remaining to complete a counting cycle of the programmable counter.

12. The medium of claim 11, further providing instructions that, when executed by the processing device, will cause the processing device to perform further operations, comprising loading the second digital divide value from the register to the programmable counter responsive to the programmable counter completing the counting cycle.

13. The medium of claim 11, wherein writing the second digital divide value to the register includes determining whether the time remaining to complete the counting cycle of the programmable counter is greater than a timing threshold.

14. The medium of claim 11, wherein the programmable counter is coupled in a loop with a phase frequency detector (PFD), a charge pump, and a voltage controlled oscillator (VCO) to form a phase-locked loop (PLL) circuit, the medium further providing instructions that, when executed by the processing device, will cause the processing device to perform further operations, comprising:
 dividing an output of the VCO by a currently loaded digital divide value with the programmable counter; and
 outputting a PFD feedback signal from the programmable counter to the PFD.

15. The medium of claim 14, further providing instructions that, when executed by the processing device, will cause the processing device to perform further operations, comprising, writing the second digital divide value to the register responsive to the PFD feedback signal changing logic states prior to a completion of the counting cycle.

16. A system, comprising:
 a phase-locked loop (PLL) circuit including a programmable counter;
 a register coupled to the PLL circuit to store digital divide values;
 a processing device communicatively coupled to write the digital divide values to the register; and
 synchronous dynamic random access memory (SDRAM) coupled to the processing device to store instructions which, when executed by the processing device, will cause the processing device to perform operations comprising:
  storing a first digital divide value in the register;
  loading the first digital divide value from the register to the programmable counter; and
  writing a second digital divide value to the register at a time responsive to a time remaining to complete a counting cycle of the programmable counter.

17. The system of claim 16, wherein writing the second digital divide value to the register includes determining whether the time remaining to complete the counting cycle of the programmable counter is greater than a timing threshold.

18. The system of claim 17, wherein the SDRAM further stores instructions that, when executed by the processing device, will cause the processing device to perform further operations, comprising writing the second digital divide value to the register during a next counting cycle of the programmable counter if the time remaining to complete the counting cycle is less than the timing threshold.

19. The system of claim 18, wherein the timing threshold is greater than or equal to an amount of time to complete the writing of the second digital divide value to the register.

20. The system of claim 16, wherein the phase-locked loop (PLL) circuit is included in a local oscillator circuit of a radio transceiver of the system, wherein the SDRAM further stores instructions that, when executed by the processing device, will cause the processing device to perform further operations, comprising providing an output frequency to a transmitter or receiver of the radio transceiver, wherein the output frequency is a first frequency when the programmable counter is counting the first digital divide value and wherein the output frequency is a second frequency when the programmable counter is counting the second digital divide value.

\* \* \* \* \*